United States Patent
Meisenzahl

(10) Patent No.: US 8,134,630 B2
(45) Date of Patent: Mar. 13, 2012

(54) SYSTEM AND METHOD FOR DRAINING RESIDUAL CHARGE FROM CHARGE-COUPLED DEVICE (CCD) SHIFT REGISTERS IN IMAGE SENSORS HAVING RESET DRAINS

(75) Inventor: Eric J. Meisenzahl, Ontario, NY (US)

(73) Assignee: Truesense Imaging, Inc., Rochester, NY (US)

( * ) Notice: Subject to any disclaimer, the term of this patent is extended or adjusted under 35 U.S.C. 154(b) by 978 days.

(21) Appl. No.: 12/118,131

(22) Filed: May 9, 2008

(65) Prior Publication Data
US 2009/0278971 A1    Nov. 12, 2009

(51) Int. Cl.
*H04N 3/14* (2006.01)
*H04N 5/335* (2011.01)
(52) U.S. Cl. .................................. 348/314; 348/299
(58) Field of Classification Search .......... 348/311–319, 348/299
See application file for complete search history.

(56) References Cited

U.S. PATENT DOCUMENTS
| | | | |
|---|---|---|---|
| 4,593,303 A | 6/1986 | Dyck et al. | |
| 6,040,859 A | 3/2000 | Takahashi | |
| 2006/0044432 A1 | 3/2006 | Stevens et al. | |

FOREIGN PATENT DOCUMENTS
| | | |
|---|---|---|
| EP | 0 614 225 A1 | 9/1994 |
| EP | 1 137 071 A2 | 9/2001 |

*Primary Examiner* — William Choi
(74) *Attorney, Agent, or Firm* — Bingham McCutchen LLP

(57) ABSTRACT

One or more charge storage regions in a charge-coupled device (CCD) shift register can contain residual charge that did not transfer to a reset drain during a reset operation. An image sensor drains the residual charge from each charge storage region by shifting the residual charge to an adjacent charge storage region and resetting the CCD shift register one more time. The process of resetting the CCD shift register, shifting the residual non-image charge to an adjacent charge storage region, and resetting the CCD shift register again can be repeated any number of times.

15 Claims, 6 Drawing Sheets

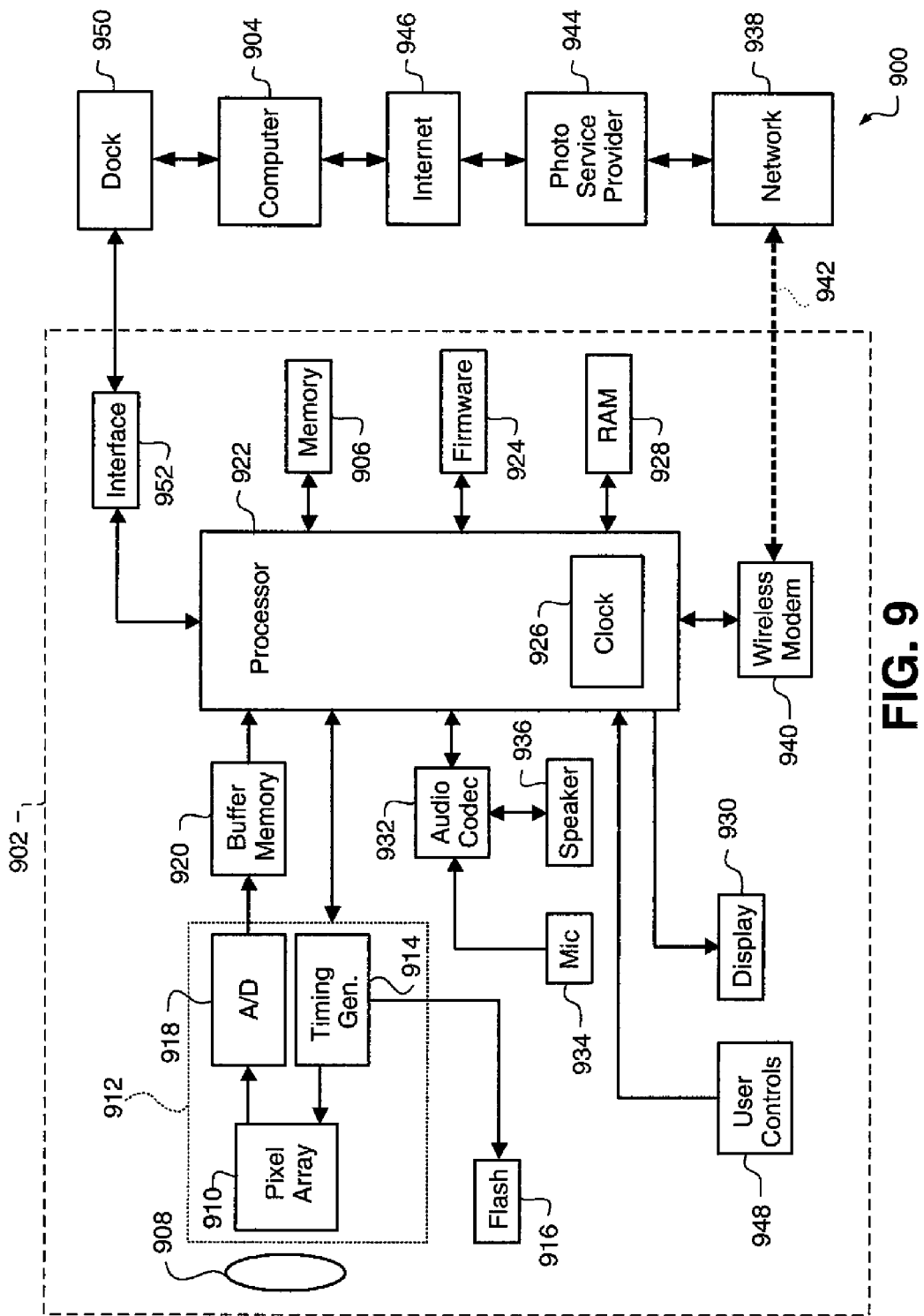

SYSTEM AND METHOD FOR DRAINING RESIDUAL CHARGE FROM CHARGE-COUPLED DEVICE (CCD) SHIFT REGISTERS IN IMAGE SENSORS HAVING RESET DRAINS

TECHNICAL FIELD

The invention relates generally to the field of image sensors, and more particularly to charge-coupled device (CCD) image sensors. Still more particularly, the invention relates to a system and method for draining residual charge from CCD shift registers in image sensors having reset drains.

BACKGROUND OF THE INVENTION

CCD image sensors capture images through photosensitive sites that generate charge in response to the intensity of light striking the photosensitive sites. FIG. 1 is a top view of a CCD image sensor in accordance with the prior art. Pixel array 100 includes rows and columns of pixels 102. Each pixel includes a photosensitive site (not shown) that generates charge in response to incident light striking the photosensitive site. To read the accumulated charges out of pixel array 100, a vertical CCD shift register (not shown) is either positioned adjacent to, or contained within, each column of photosensitive sites to receive and shift the accumulated charges to horizontal CCD shift register 104. The charges are shifted through the vertical CCD shift register in a row-by-row or in parallel process. Horizontal CCD shift register 104 receives the charges from the vertical CCD shift registers and sequentially shifts each row of accumulated charges to output amplifier 106 in a pixel-by-pixel or serial manner.

The CCD shift registers are emptied of all non-image related charges, such as dark current, prior to image exposure and readout of the accumulated image-related charges. This is known as a reset or flush operation. Resetting the CCD shift registers prior to image capture allows an image sensor to output an accurate representation of a captured image. FIGS. 2(a)-2(b) are graphical illustrations of a reset operation in a CCD shift register in accordance with the prior art. Non-image or unwanted charges 200 collect in CCD charge storage regions 202, 204, 206, 208, 210, as shown in FIG. 2(a). A reset operation is performed to cause non-image charges 200 to transfer from charge storage regions 202, 204, 206, 208, 210 to a reset drain (not shown). FIG. 2(b) depicts charge storage regions 202, 204, 206, 208, 210 after the reset operation.

Unfortunately, some residual non-image charge 212 remains in charge storage region 206 after the reset operation. Manufacturing defects typically cause non-image charge 200 in charge storage region 206 to transfer incompletely to the reset drain. For example, misalignment of gates, defects in the semiconductor substrate, and added or missing materials can result in residual charge remaining in a charge storage region of a CCD after a reset operation. When residual non-image charge 212 remains in one or more charge storage regions of a CCD, an image sensor does not produce an accurate representation of a captured image.

SUMMARY OF THE INVENTION

After a first reset operation is performed on one or more CCD shift registers in an image sensor, any residual non-image charge that remains in one or more charge storage regions is shifted to an adjacent charge storage region and the CCD shift register is reset a second time. The charge can be shifted forward or backward within the CCD to an immediately adjacent charge storage region or to a charge storage region located two or more charge storage regions away from the initial charge storage region. The process of resetting one or more CCD shift registers, shifting any residual charge to an adjacent charge storage region, and resetting the one or more CCD shift registers again can be repeated any number of times. A timing generator generates the clocking signal or signals used to shift charge through the one or more CCD shift registers. The timing generator also generates the signal or signals used to reset the one or more CCD shift registers multiple times. The one or more CCD shift registers can be vertical CCD shift registers included in a pixel array or horizontal CCD shift registers that receive charge from the vertical CCD shift registers and sequentially shift charge to an output amplifier or other readout circuitry.

These and other aspects, objects, features and advantages of the present invention will be more clearly understood and appreciated from a review of the following detailed description of embodiments in accordance with the invention and the appended claims, and by reference to the accompanying drawings.

BRIEF DESCRIPTION OF THE DRAWINGS

FIG. 9 is a block diagram of an imaging system that can use an image sensor that implements the method shown in FIG. 6 in an embodiment in accordance with the invention.

DETAILED DESCRIPTION OF THE INVENTION

Figure 1:
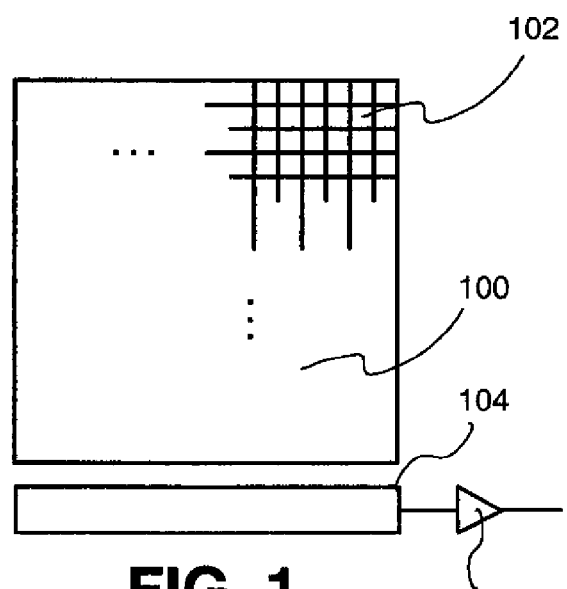
FIG. 1 is a top view of a CCD image sensor in accordance with the prior art.
Figure 2A:
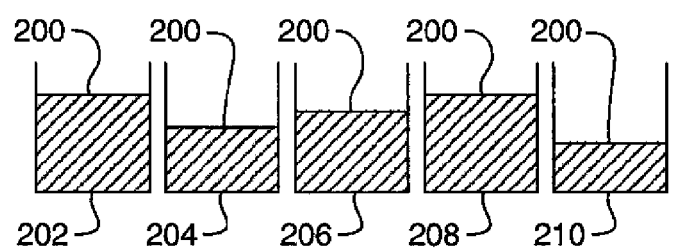
FIGS. 2(a)-2(b) are graphical illustrations of a reset operation in a CC)D shift register in accordance with the prior art.
Figure 2B:
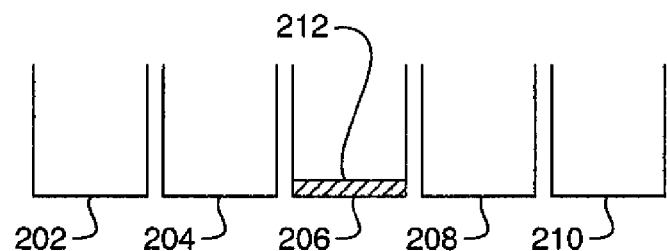

In the following Detailed Description, reference is made to the accompanying drawings, which form a part hereof, and in which is shown by way of illustration an exemplary embodiment in which the invention may be practiced. In this regard, directional terminology, such as "top," "bottom," "front," "back," "leading," "trailing," "forward," "backward," etc., is used with reference to the orientation of the Figure(s) being described. Because components of embodiments of the present invention can be positioned in a number of different orientations, the directional terminology is used for purposes of illustration and is in no way limiting.

Throughout the specification and claims, the following terms take the meanings explicitly associated herein, unless the context clearly dictates otherwise. The meaning of "a," "an," and "the" includes plural reference, the meaning of "in" includes "in" and "on." The term "connected" means either a direct electrical connection between the items connected or an indirect connection through one or more passive or active intermediary devices. The term "circuit" means either a single component or a multiplicity of components, either active or passive, that are connected together to provide a desired function. The term "signal" means at least one current, voltage, or data signal. Referring to the drawings, like numbers indicate like parts throughout the views.

Figure 3:
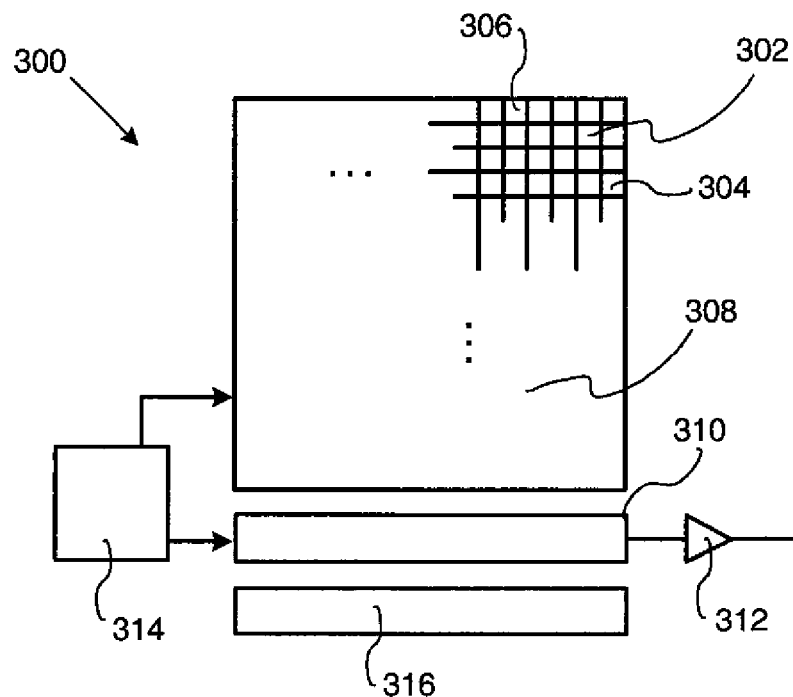
FIG. 3 is a top view of an image sensor in an embodiment in accordance with the invention.

Referring now to FIG. 3, there is shown a top view of an image sensor in an embodiment in accordance with the invention. Image sensor 300 includes pixels 302 that are arranged in rows 304 and columns 306 to form pixel array 308. Pixel array 308 can have any number of pixels, such as, for example, 1280 columns by 960 rows of pixels. Image sensor 300 is implemented as a charge-coupled device (CCD) image sensor in an embodiment in accordance with the invention.

Each pixel 302 includes a photosensitive site (not shown) that generates charge in response to the amount of incident light striking the photosensitive site. During readout of pixel array 308, charge is either transferred from each photosensitive site to an adjacent charge storage region in a vertical CCD shift register (not shown), or maintained within the same photosensitive site when the CCD shift register itself is the photosensitive site. Each column 306 includes a vertical CCD shift register that shifts charge vertically from charge storage region to charge storage region in parallel with the other vertical CCD shift registers in pixel array 308. Since all of the vertical CCD shift registers in pixel array 308 shift charge in parallel, the vertical CCD shift registers are also known by those skilled in the art as parallel shift registers. Charge is transferred from each vertical CCD shift registers to a corresponding reset drain or drains prior to an image capture or readout operation Charge is then transferred from the vertical CCD shift registers to horizontal CCD shift register 310 and sequentially output to amplifier 312. Horizontal CCD shift register 310 is also known by those skilled in the art as a sequential or serial shift register. Timing generator 314 generates the signals needed to shift charge through the vertical CCD shift registers and horizontal CCD shift register 310. Charge is transferred from horizontal CCD shift register 310 to reset drain 3 16 prior to an image capture or readout operation.

Although FIG. 3 depicts one horizontal CCD shift register 310, other embodiments in accordance with the invention are not limited to this structure. Two or more horizontal CCD shift registers can be included in an image sensor in other embodiments in accordance with the invention.

Figure 4:
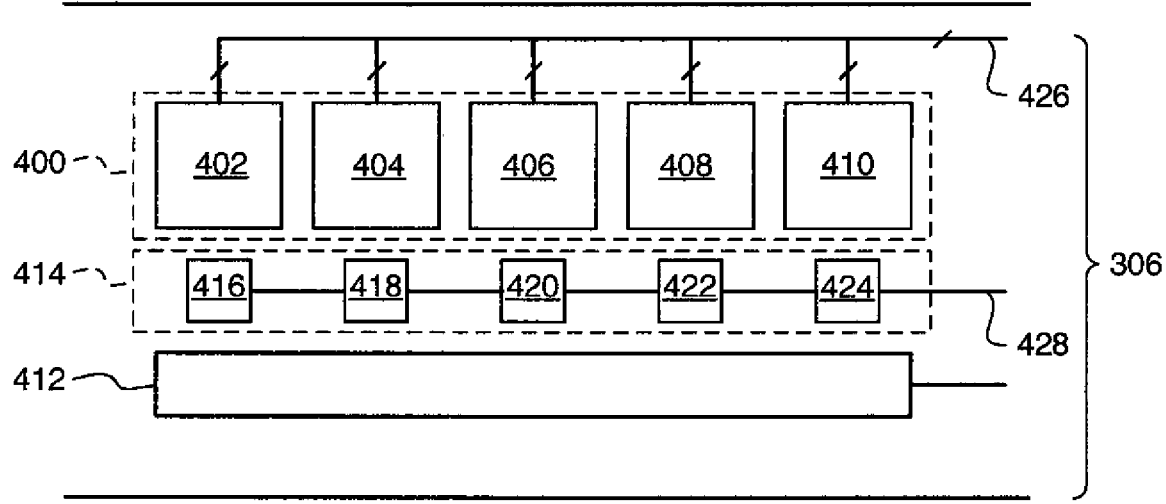
FIG. 4 is a simplified block diagram of one column 306 in pixel array 308 shown in FIG. 3 in an embodiment in accordance with the invention.

FIG. 4 is a simplified block diagram of one column 306 in pixel array 308 shown in FIG. 3 in an embodiment in accordance with the invention. Each column 306 includes a column 400 of charge storage regions 402, 404, 406, 408, 410, reset drain 412, and transfer mechanism 414 positioned between charge storage regions 402, 404, 406, 408, 410 and reset drain 412. Transfer mechanism 414 is used to transfer charge from each charge storage region 402, 404, 406, 408, 410 to reset drain 412. In the embodiment shown in FIG. 4, reset drain 412 is a common reset drain used by all of the charge storage regions 402, 404, 406, 408, 410 in column 400, and transfer mechanism 414 is a series of transfer gates 416, 418, 420, 422, 424 positioned adjacent respective charge storage regions 402, 404, 406, 408, 410.

Those skilled in the art will recognize that reset drain 412 and transfer mechanism 414 can be implemented differently in other embodiments in accordance with the invention. For example, reset drain 412 can be implemented vertically rather than laterally to the charge storage regions such as commonly found in CCD architectures with vertical overflow drains. Additionally, transfer mechanism 414 can be configured as a vertical charge potential barrier to a vertically located reset drain. In this case, the potential barrier is formed by selective substrate doping and can be selectively removed by voltage modulation of the drain bias.

Column 400 of charge storage regions 402, 404, 406, 408, 410 is implemented as a vertical CCD shift register with each charge storage region 402, 404, 406, 408, 410 operating as both a photosensitive site and a charge storage region used to shift charge through the vertical CCD shift register in an embodiment in accordance with the invention. Other embodiments in accordance with the invention can configure column 400 of charge storage regions 402, 404, 406, 408, 410 differently. By way of example only, column 400 of charge storage regions 402, 404, 406, 408, 410 can be implemented as only charge storage regions of a vertical CCD shift register with each charge storage region positioned adjacent a photosensitive site.

One or more clocking signals that are generated by timing generator 314 in FIG. 3 are input on signal line 426 to shift charge from one charge storage region to an adjacent charge storage region. A transfer mechanism enable signal (TM), also generated by timing generator 314 (FIG. 3), is input on signal line 428 to enable transfer gates 416, 418, 420, 422, 424 and cause charge to transfer from respective charge storage regions 402, 404, 406, 408, 410 to reset drain 412.

Although only five charge storage regions 402, 404, 406, 408, 410 and five transfer gates 416, 418, 420, 422, 424 are shown in FIG. 4, those skilled in the art will appreciate that an image sensor can include any number of charge storage regions and transfer gates. Typically, in practice, there is at least one charge storage region in a vertical CCD shift register for each photosensitive site in the pixel array. Moreover, each vertical CCD shift register can use one or more phases to shift charge through the vertical CCD shift register in other embodiments in accordance with the invention.

Figure 5:
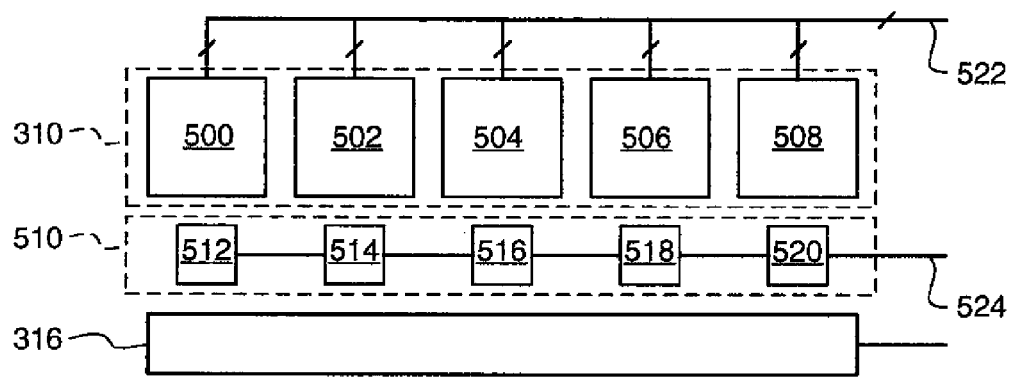
FIG. 5 is a simplified block diagram of horizontal CCD shift register 310 and drain 316 shown in FIG. 3 in an embodiment in accordance with the invention.

Referring now to FIG. 5, there is shown a simplified block diagram of horizontal CCD shift register 310 and drain 316 shown FIG. 3 in an embodiment in accordance with the invention. Horizontal CCD shift register 310 includes a series of charge storage regions 500, 502, 504, 506, 508. Transfer mechanism 510 is positioned between charge storage regions 500, 502, 504, 506, 508 and reset drain 316. Transfer mechanism 510 transfers charge from each charge storage region 500, 502, 504, 506, 508 to reset drain 316. In the embodiment shown in FIG. 5, reset drain 316 is a common reset drain used by all of the charge storage regions 500, 502, 504, 506, 508 in horizontal CCD shift register 310, and transfer mechanism 510 is a series of transfer gates 512, 514, 516, 518, 520 positioned adjacent respective charge storage regions 500, 502, 504, 506, 508. Reset drain 316 and transfer mechanism 510 can be implemented differently in other embodiments in accordance with the invention.

One or more clocking signals generated by timing generator 314 in FIG. 3 are input on signal line 522 to shift charge from one charge storage region to an adjacent charge storage region in horizontal CCD shift register 310. A transfer mechanism enable signal (TM), also generated by timing generator 314 (FIG. 3), is input on signal line 524 to enable transfer gates 512, 514, 516, 518, 520 and cause charge to transfer from respective charge storage regions 500, 502, 504, 506, 508 to reset drain 316.

Although only five charge storage regions 500, 502, 504, 506, 508 and five transfer gates 512, 514, 516, 518, 520 are shown in FIG. 5, those skilled in the art will appreciate that an image sensor can include any number of charge storage regions and transfer gates. Typically, in practice, there is at least one charge storage region in one or more horizontal CCD shift registers for each column in the pixel array. Moreover, each horizontal CCD shift register can use one or more phases to shift charge through the horizontal CCD shift register in other embodiments in accordance with the invention.

Figure 6:
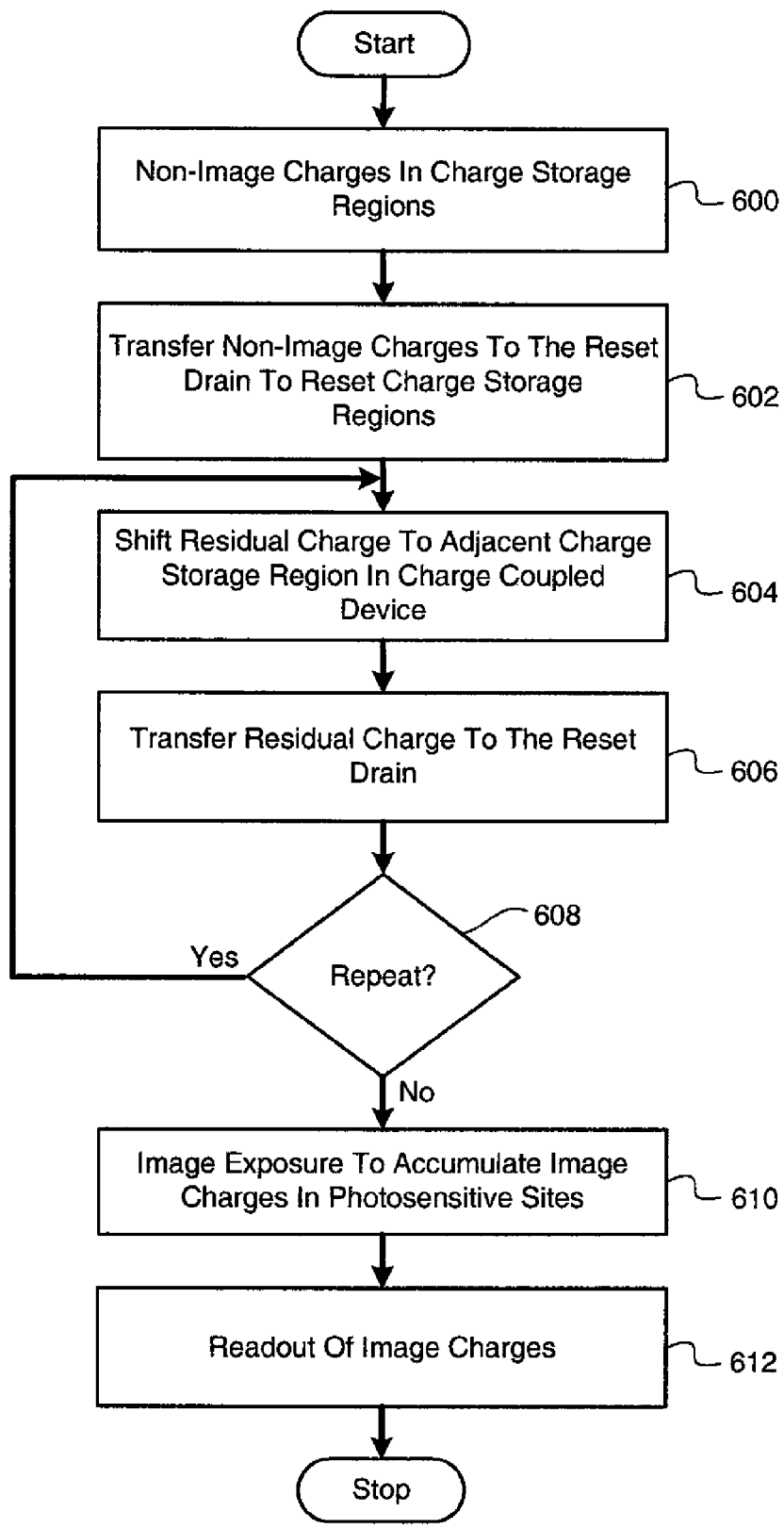
FIG. 6 is a flowchart of a method for draining residual non-image charge from a charge-coupled device shift register in an embodiment in accordance with the invention.
Figure 7A:
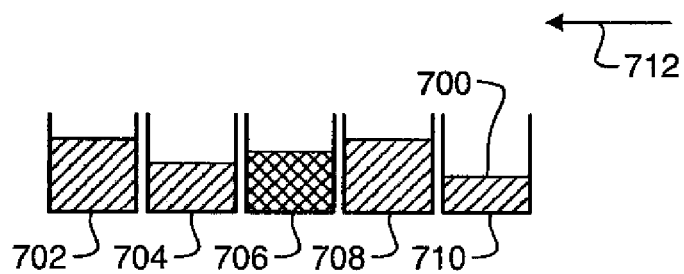
FIGS. 7(a)-7(d) are graphical illustrations of the method shown in FIG. 6 using the timing depicted in FIG. 8.

FIG. 6 is a flowchart of a method for draining residual non-image charge from a charge-coupled device shift register in an embodiment in accordance with the invention. The method of FIG. 6 will be described in conjunction with the illustrations in FIGS. 7(a)-7(d). Initially unwanted or non-image charges, such as, for example, dark current charges, collect in the charge storage regions, as shown in block 600. FIG. 7(a) depicts non-image charges 700 in respective charge storage regions 702, 704, 706, 708, 710. Charge storage regions 702, 704, 706, 708, 710 can be located in either a vertical CCD shift register or a horizontal CCD shift register. Image charges or non-image charges are shifted through the charge storage regions 702, 704, 706, 708, 710 in the direction indicated by arrow 712.

Returning to FIG. 6, the non-image charges are then transferred to the reset drain, as shown in block 602. This step is known as a reset operation, and can be performed at various times during the operation of an image sensor. Typically, one such time is prior to image capture and readout where the photosensitive sites are reset to a predetermined charge level. One example of a predetermined charge level is a no signal or zero charge level.

Figure 7B:
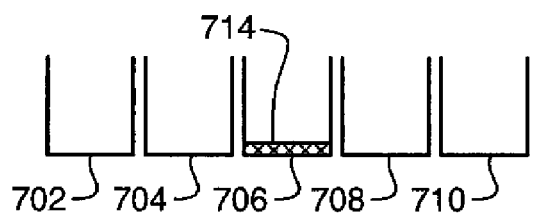

FIG. 7(b) illustrates charge storage regions 702, 704, 706, 708, 710 after the reset operation has been performed. Charge storage regions 702, 704, 708, 710 are empty, while some residual non-image charge 714 remains in charge storage region 706. Residual charge 714 represents unwanted charge that remains in a charge storage region after a reset operation.

Figure 7C:
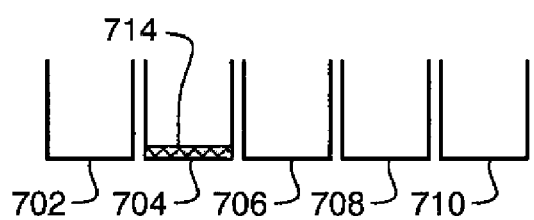

Referring now to block 604 in FIG. 6, any residual non-image charge that remains in one or more charge storage regions is then shifted to an adjacent charge storage region in the CCD. FIG. 7(c) depicts residual non-image charge 714 shifted forward (i.e., in the direction of arrow 712) from charge storage region 706 to charge storage region 704. Although residual non-image charge 714 is depicted as shifting forward to the immediately adjacent charge storage region 704, embodiments in accordance with the invention are not limited to this implementation. Residual non-image charge 714 can be shifted forward two or more charge storage regions, such as, for example, from charge storage region 706 to charge storage region 702.

Figure 7D:

After the residual non-image charge is shifted to an adjacent charge storage region, another reset operation is performed to transfer the residual non-image charge to the reset drain (block 606 in FIG. 6). FIG. 7(d) illustrates charge storage regions 702, 704, 706, 708, 710 after the second reset of charge storage regions 702, 704, 706, 708, 710. By shifting residual non-image charge 714 from a charge storage region that is not able to efficiently transfer charge to a reset drain (e.g., charge storage region 706) to an adjacent charge storage region that is able to efficiently transfer charge to the reset drain (e.g., charge storage region 704), residual non-image charge 714 is transferred to the reset drain during the second reset of charge storage regions 702, 704, 706, 708, 710.

Returning to FIG. 6, a determination is made at block 608 as to whether or not the method is to return to block 604. In one embodiment in accordance with the invention, only one reset-shift-reset operation is performed. Other embodiments in accordance with the invention can perform two or more reset-shift-reset operations.

If the method is to return to block 604, blocks 604, 606, and 608 are repeated for a given number of times or until the charge storage regions are empty of all, or nearly all, residual non-image charge. Although FIG. 7(d) depicts charge storage regions 702, 704, 706, 708, 710 as empty of charges, embodiments in accordance with the invention are not limited to this condition. Resetting a CCD shift register, shifting the residual non-image charge to an adjacent charge storage region, and then resetting the CCD shift register again can be repeated until one or more charge storage regions are substantially, but not completely, empty of non-image charges. By way of example only, the amount of time needed to completely empty all charge storage regions of charges may be too long, so the steps of resetting, shifting residual charge, and resetting are performed a predetermined number of times in some embodiments in accordance with the invention. The predetermined number of times may be determined, for example, through statistical analysis or testing of the image sensor to determine the number of reset operations that result in an acceptable amount of residual non-image charges remaining in one or more charge storage regions.

Referring again to block 608, the method passes to block 610 when the process does not repeat. At block 610, an image is captured by the pixel array and the photosensitive sites accumulate image charges. When the image exposure time period ends, the image charges are read out of the pixel array (block 612).

Figure 8:
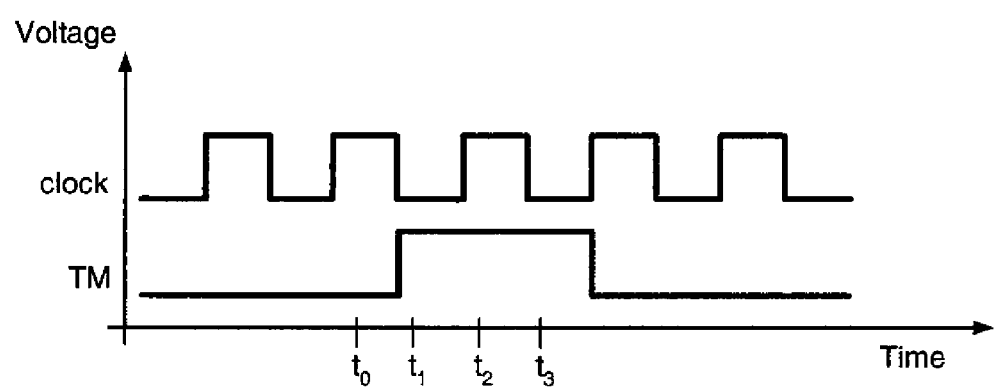
FIG. 8 is an exemplary timing diagram for a reset operation in a charge-coupled device shift register in an embodiment in accordance with the invention.

Referring now to FIG. 8, there is shown an exemplary timing diagram for a reset operation in a charge-coupled device shift register in an embodiment in accordance with the invention. Initially, at time $t_0$, one or more charge storage regions contains non-image charges and the signal "clock" is clocking the charge storage regions to shift charge through a CCD. The clock signal is input on signal line 426 in the embodiment shown in FIG. 4 and on signal line 522 in the embodiment shown in FIG. 5.

At time $t_1$, a reset operation is performed when the transfer mechanism enable signal (TM) is enabled, thereby causing the non-image charges to transfer to the reset drain. The TM signal is input on signal line 428 in the embodiment shown in FIG. 4 and on signal line 524 in the embodiment shown in FIG. 5.

Any residual non-image charge that remains in one or more charge storage regions is then shifted to an adjacent charge storage region at time $t_2$. In the embodiment of FIG. 8, this is accomplished by maintaining signal TM in an enabled state while the charge storage regions are clocked. At time $t_3$, another reset operation occurs and causes the residual non-image charge that has been shifted to the adjacent charge storage region to transfer to the reset drain.

Embodiments in accordance with the invention are not limited to the timing diagram illustrated in FIG. 8. Other forms of timing can be used in other embodiments in accordance with the invention. For example, the TM signal may be cycled on and off in synchronization with the clocking signal or signals input on signal line 426 (FIG. 4) and signal line 522 (FIG. 5).

FIG. 9 is a block diagram of an imaging system that can use an image sensor that implements the method shown in FIG. 6 in an embodiment in accordance with the invention. Imaging system 900 includes digital camera phone 902 and computing device 904. Digital camera phone 902 is only one example of an image capture device that can use an image sensor that implements embodiments in accordance with the invention. Other types of image capture devices, such as, for example, digital still cameras and digital video camcorders can use one or more image sensors that implement embodiments in accordance with the invention.

Digital camera phone 902 is a portable, handheld, battery-operated device in an embodiment in accordance with the invention. Digital camera phone 902 produces digital images that are stored in memory 906, which can be, for example, an internal Flash EPROM memory or a removable memory card. Other types of digital image storage media, such as magnetic hard drives, magnetic tape, or optical disks, can alternatively be used to implement memory 906.

Digital camera phone 902 uses lens 908 to focus light from a scene (not shown) onto pixel array 910 of image sensor 912. Pixel array 910 provides color image information using the Bayer color filter pattern in an embodiment in accordance with the invention. Pixel array 910 is controlled by timing generator 914, which also controls flash 916 in order to illuminate the scene when the ambient illumination is low.

The analog output signals output from the pixel array 910 are amplified and converted to digital data by analog-to-digital (A/D) converter circuit 918. The digital data are stored in buffer memory 920 and subsequently processed by processor 922. Processor 922 is controlled by the firmware stored in firmware memory 924, which can be flash EPROM memory. Processor 922 includes real-time clock 926, which keeps the date and time even when digital camera phone 902 and processor 922 are in a low power state. The processed digital image files are stored in memory 906. Memory 906 can also store other types of data, such as, for example, music files (e.g. MP3 files), ring tones, phone numbers, calendars, and to-do lists.

In one embodiment in accordance with the invention, digital camera phone 902 captures still images. Processor 922 performs color interpolation followed by color and tone correction, in order to produce rendered sRGB image data. The rendered sRGB image data are then compressed and stored as an image file in memory 906. By way of example only, the image data can be compressed pursuant to the JPEG format, which uses the known "Exif" image format. This format includes an Exif application segment that stores particular image metadata using various TIFF tags. Separate TIFF tags can be used, for example, to store the date and time the picture was captured, the lens f/number and other camera settings, and to store image captions.

Processor 922 produces different image sizes that are selected by the user in an embodiment in accordance with the invention. One such size is the low-resolution "thumbnail" size image. Generating thumbnail-size images is described in commonly assigned U.S. Pat. No. 5,164,831, entitled "Electronic Still Camera Providing Multi-Format Storage Of Full And Reduced Resolution Images" to Kuchta, et al. The thumbnail image is stored in RAM memory 928 and supplied to display 930, which can be, for example, an active matrix LCD or organic light emitting diode (OLED). Generating thumbnail size images allows the captured images to be reviewed quickly on color display 930.

In another embodiment in accordance with the invention, digital camera phone 902 produces and stores video clips. A video clip with a lower resolution video image frame is produced by summing multiple pixels of pixel array 910 together (e.g. summing pixels of the same color within each 4 column×4 row area of the pixel array 910). The video image frames are read from pixel array 910 at regular intervals, for example, using a 19 frame per second readout rate.

Audio codec 932 is connected to processor 920 and receives an audio signal from microphone (Mic) 934. Audio codec 932 also provides an audio signal to speaker 936. These components are used both for telephone conversations and to record and playback an audio track, along with a video sequence or still image.

Speaker 936 is also used to inform the user of an incoming phone call in an embodiment in accordance with the invention. This can be done using a standard ring tone stored in firmware memory 924, or by using a custom ring-tone downloaded from mobile phone network 938 and stored in memory 906. In addition, a vibration device (not shown) can be used to provide a silent (e.g. non-audible) notification of an incoming phone call.

Processor 922 is connected to wireless modem 940, which enables digital camera phone 902 to transmit and receive information via radio frequency (RF) channel 942. Wireless modem 940 communicates with mobile phone network 938 using another RF link (not shown), such as a 3GSM network. Mobile phone network 938 communicates with photo service provider 944, which stores digital images uploaded from digital camera phone 902. Other devices, including computing device 904, access these images via the Internet 946. Mobile phone network 938 also connects to a standard telephone network (not shown) in order to provide normal telephone service in an embodiment in accordance with the invention.

A graphical user interface (not shown) is displayed on display 930 and controlled by user controls 948. User controls 948 include dedicated push buttons (e.g. a telephone keypad) to dial a phone number, a control to set the mode (e.g. "phone" mode, "calendar" mode" "camera" mode), a joystick controller that includes 4-way control (up, down, left, right) and a push-button center "OK" or "select" switch, in embodiments in accordance with the invention.

Dock 950 recharges the batteries (not shown) in digital camera phone 902. Dock 950 connects digital camera phone 902 to computing device 904 via dock interface 952. Dock interface 952 is implemented as wired interface, such as a USB interface, in an embodiment in accordance with the invention. Alternatively, in other embodiments in accordance with the invention, dock interface 952 is implemented as a wireless interface, such as a Bluetooth or an IEEE 802.11b wireless interface. Dock interface 952 is used to download images from memory 906 to computing device 904. Dock interface 952 is also used to transfer calendar information from computing device 904 to memory 906 in digital camera phone 902.

The invention has been described in detail with particular reference to embodiments in accordance with the invention, but it will be understood that variations and modifications can be effected within the spirit and scope of the invention. For example, FIG. 7 describes the image and residual non-image charges shifting uni-directionally, or in the direction depicted by arrow 712. Other embodiments in accordance with the invention, however, can shift charge bi-directionally, thereby allowing the image charges, non-image charges, or the residual non-image charges to be shifted forward or backward within a CCD shift register.

PARTS LIST 100 pixel array
102 pixel
104 horizontal charge-coupled device shift register
106 amplifier
200 charge
202 charge storage region
204 charge storage region
206 charge storage region
208 charge storage region
210 charge storage region
212 residual non-image charge 300 image sensor
302 pixel
304 row
306 column
308 pixel array
310 horizontal charge-coupled device shift register
312 amplifier
314 timing generator
316 reset drain
400 column
402 charge storage region
404 charge storage region
406 charge storage region
408 charge storage region
410 charge storage region
412 reset drain
414 transfer mechanism
416 transfer gate
418 transfer gate
420 transfer gate
422 transfer gate
424 transfer gate
426 signal line
428 signal line
500 charge storage region
502 charge storage region
504 charge storage region
506 charge storage region
508 charge storage region
510 transfer mechanism
512 transfer gate
514 transfer gate
516 transfer gate
518 transfer gate
520 transfer gate
522 signal line
524 signal line
700 charge
702 charge storage region
704 charge storage region
706 charge storage region
708 charge storage region
710 charge storage region
712 direction of charge shift
714 residual charge
900 imaging system
902 camera phone
904 computing device
906 memory
908 lens
910 image sensor array
912 active pixel sensor
914 timing generator
916 flash
918 analog-to-digital converter
920 buffer memory
922 digital processor
924 firmware memory
926 clock
928 RAM memory
930 display
932 audio codec
934 microphone
936 speaker
938 mobile phone network
940 wireless modem
942 RF channel
944 photo service provider
946 internet
948 user controls
950 dock
952 dock interface

The invention claimed is:

1. An image sensor, comprising:
 a charge-coupled device (CCD) shift register having a plurality of charge storage regions;
 a reset drain;
 a transfer mechanism positioned between the CCD shift register and the reset drain to transfer charge from each charge storage region to the reset drain; and
 a timing generator for enabling a first reset of the plurality of charge storage regions such that non-image charges in the plurality of charge storage regions are transferred to the reset drain, and after the first reset is performed, for generating clock signals to shift any residual non-image charge remaining in at least one charge storage region to a respective adjacent charge storage region and then enabling a second reset to transfer the residual non-image charge to the reset drain.

2. The image sensor of claim 1, wherein the transfer mechanism includes a plurality of transfer gates with each transfer gate adjacent a charge storage region.

3. The image sensor of claim 2, wherein the CCD shift register comprises a horizontal CCD shift register.

4. The image sensor of claim 2, wherein the CCD shift register comprises a vertical CCD shift register, and wherein the vertical CCD shift register, the reset drain, and the plurality of transfer gates are included in a column of pixels within a pixel array.

5. The image sensor of claim 1, wherein the reset drain comprises a common reset drain that receives charge from all of the charge storage regions in the CCD shift register.

6. The image sensor of claim 1, wherein the image sensor is disposed in an image capture device.

7. In an image sensor, a method for draining residual non-image charge from a charge-coupled device (CCD) shift register to a reset drain, wherein the CCD shift register includes a plurality of charge storage regions, the method comprising:
 (a) transferring non-image charge from the CCD shift register to the reset drain;
 (b) after transferring the non-image charge to the reset drain, shifting any residual non-image charge remaining in at least one of the charge-storage regions in the CCD shift register to a respective adjacent charge-storage region; and
 (c) after shifting the residual non-image charge, transferring the residual non-image charge in the adjacent charge-storage region to the reset drain.

8. The method of claim 7, further comprising (d) repeating (b) and (c) for a given number of times.

9. The method of claim 7, wherein transferring non-image charge from the CCD shift register to the reset drain comprises transferring non-image charge from the CCD shift register to a common reset drain.

10. In an image sensor, a method for draining residual non-image charge from a charge-coupled device (CCD) shift register to a reset drain, where the CCD shift register includes a plurality of charge storage regions, the method comprising:
 (a) enabling a transfer mechanism;
 (b) transferring non-image charge from the CCD shift register to the reset drain;
 (c) after transferring the non-image charge to the reset drain, shifting any residual non-image charge remaining in at least one charge storage region in the CCD shift register to a respective adjacent charge storage region; and (d) after shifting the residual non-image charge, transferring the residual non-image charge in the adjacent charge storage region to the reset drain.

11. The method of claim 10, further comprising disabling the transfer mechanism.

12. The method of claim 11, further comprising repeating (c) and (d) for a given number of times prior to disabling the transfer mechanism.

13. The method of claim 12, wherein the transfer mechanism remains enabled while (c) and (d) are repeated.

14. The method of claim 10, wherein enabling a transfer mechanism comprises enabling a plurality of transfer gates where each transfer gate is adjacent a charge storage region.

15. The method of claim 10, wherein transferring non-image charge from the CCD shift register to the reset drain comprises transferring non-image charge from the CCD shift register to a common reset drain.

* * * * *